United States Patent [19]

Hsu

[11] Patent Number: 5,454,727
[45] Date of Patent: Oct. 3, 1995

[54] ELECTRICAL CONNECTOR WITH ZIF SOCKET

[76] Inventor: Fu-Yu Hsu, No. 1-2, Lane 975, Chun-Jih Road, Tao-Yuan City, Taiwan, Prov. of China

[21] Appl. No.: 194,309

[22] Filed: Feb.-10, 1994

[51] Int. Cl.[6] ............................ H01R 13/62; H01R 13/15
[52] U.S. Cl. ............................................. 439/263; 439/342
[58] Field of Search ..................................... 439/259–268, 439/269, 342, 347, 330, 331

[56] References Cited

U.S. PATENT DOCUMENTS

| | | | |
|---|---|---|---|
| 4,498,725 | 2/1985 | Bright et al. | 439/342 |
| 4,988,310 | 1/1991 | Bright et al. | 439/342 |
| 5,057,031 | 10/1991 | Sinclair | 439/259 |
| 5,167,515 | 12/1992 | Matsuoka et al. | 439/342 |
| 5,256,080 | 10/1993 | Bright | 439/342 |
| 5,299,950 | 4/1994 | Kaneko | 439/342 |

*Primary Examiner*—Gary F. Paumen
*Assistant Examiner*—Hien D. Vu
*Attorney, Agent, or Firm*—Morton J. Rosenberg; David I. Klein

[57] ABSTRACT

This invention relates to an electrical connector with zero insert force (ZIF) socket. When the sliding support is moved traverse, the pins of the Pin Grid Arrays (PGA) packages can be received and retained by the specially designed terminal connecting end to facilitate an easily mounting and excellent conductivity as well as durability. Characterized in that a pin socket is formed directly from punching a metal sheet. A first supporting arm and a second supporting arm are defined thereof. The first supporting arm has a longer length than the second supporting arm. The first supporting arm and the second supporting arm are further formed a first contacting end and a second contacting end respectively at their upper portion. The first contacting end and the second contacting end are intersected with each other. A first curve portion is formed at the first supporting arm and a second curve portion being formed at the second supporting arm. The first curve portion is larger than the second curve portion. The first contacting end and the second contacting end being separated with each other. A first conductive surface and a second conductive surface are defined at the first contacting end and the second contacting end respectively thereof. The end result is reflected in the reduction in friction resistance and increase in the service life of the device.

2 Claims, 10 Drawing Sheets

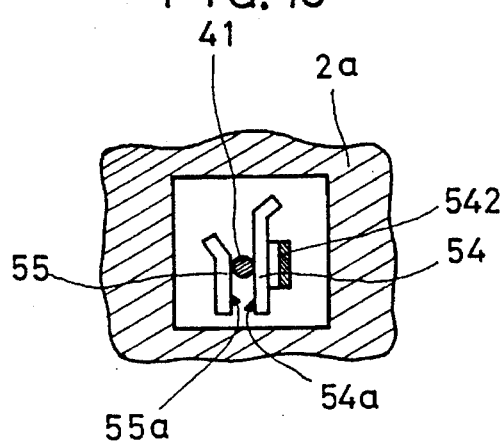
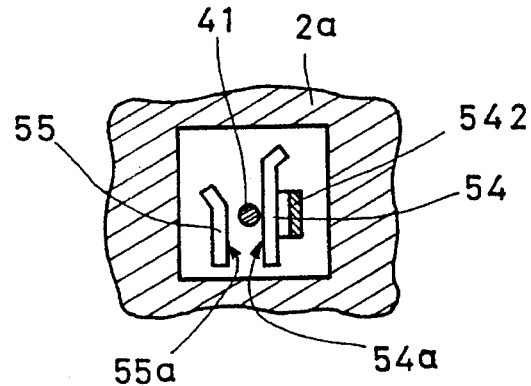
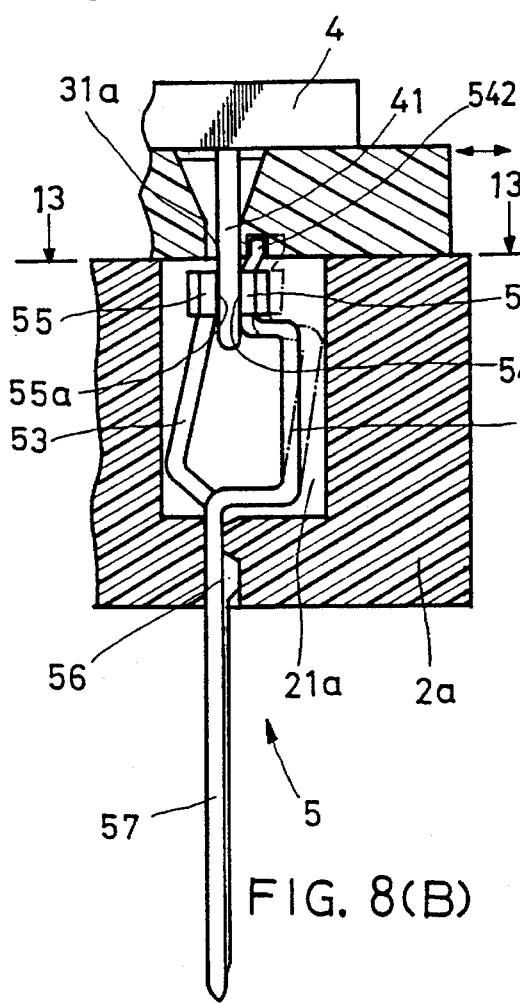
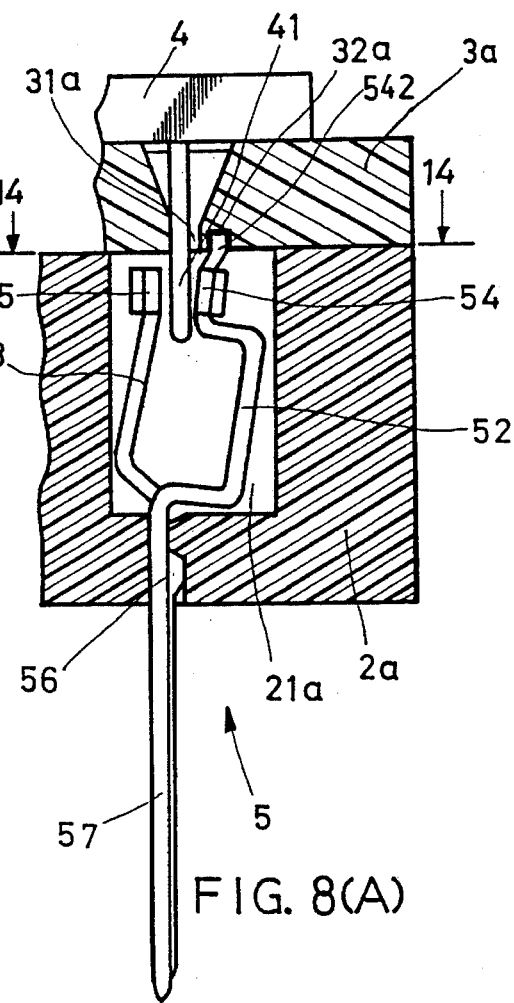

FIG. 9(C)
PRIOR ART
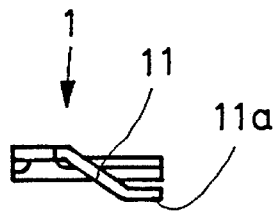
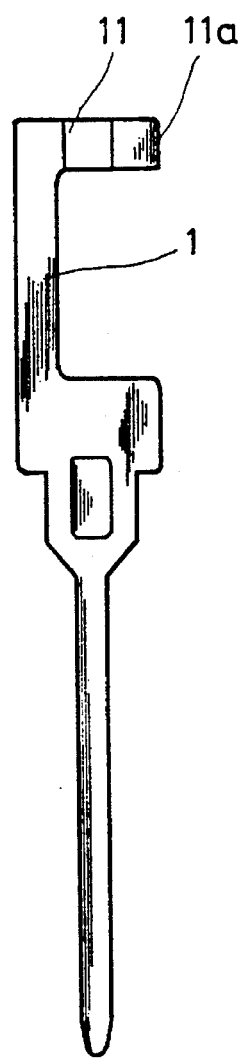
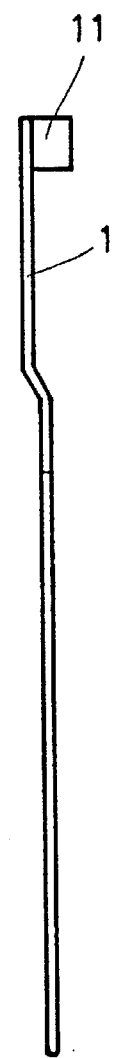
FIG. 9(A)
PRIOR ART
FIG. 9(B)
PRIOR ART

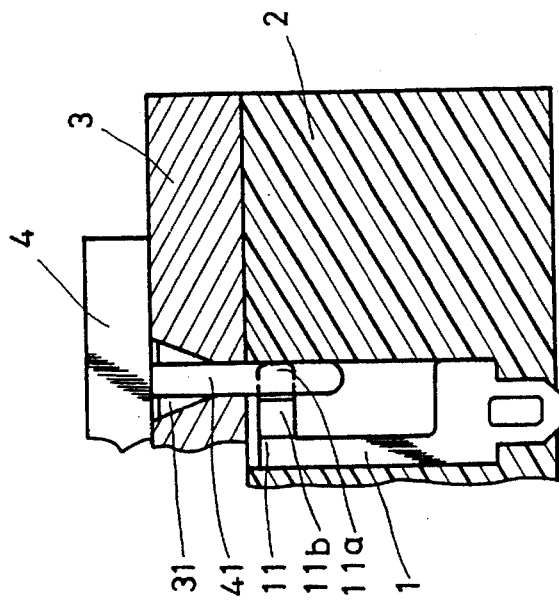
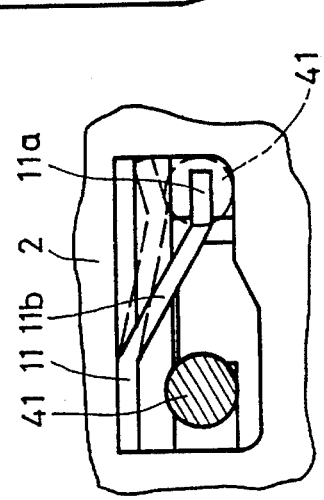
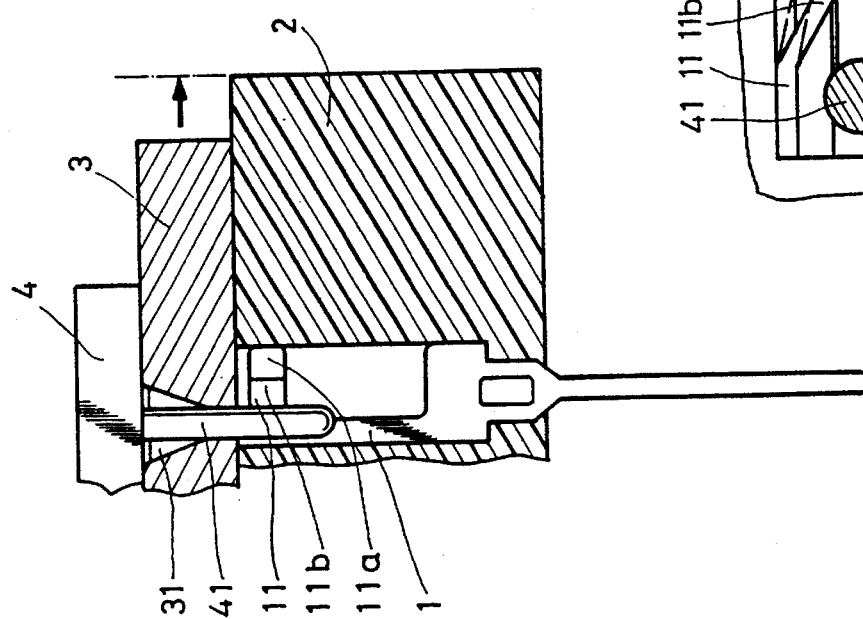

ELECTRICAL CONNECTOR WITH ZIF SOCKET

BACKGROUND OF THE INVENTION

This invention relates to an electrical connector, more particularly, to an electrical connector with zero insert force (ZIF) socket. When the sliding support is moved traverse, the pins of the Pin Grid Arrays (PGA) packages can be received and retained by the specially designed terminal connecting end to facilitate an easily mounting and excellent conductivity as well as durability.

The PGA socket features an easy removal and mounting of the PGA packages inserted thereof. By this arrangement, the user can complete the replacement of the PGA packages by himself without applying any special tools. Besides, the replacement of the PGA can be easily done by a user, but not a technician.

In light of this, the ZIF socket is more convenient and useful than the low insert force (LIF). The ZIF socket has been described at many publications, such U.S. Pat. Nos. 4,498,725, 4,988,310; Japanese Patents No. 1-47430, 2-197017; and ROC patent applications No. 80-2-08893, 81-1-104728. Although those socket disclosed in said patents can achieve their own objects, there are still some shortcomings.

As shown in FIGS. 9 and 10, the typical structure of the ZIF socket, the pin socket 1 has a contacting portion 11 at the upper end. The contacting portion 11 defines an inclined elastic body. The pin socket 1 is fixed to the socket body 2. A sliding housing 3 is disposed at the socket 2. The pins 41 of the PGA packages 4 are first inserted through the holes 31 of the sliding housing 3, and then engage into the housing 2. As shown in FIG. 10A, the pin 41 has not been received and engaged with the contacting portion 11 of the pin socket 1. As shown in FIG. 10B, when the sliding housing 3 is moved traverse, the pin 41 moves to the right accordingly to engage with the conductive end 11a of the contacting portion 11. As shown in FIG. 10C, when the in 41 is pushed toward the conductive end 11a, inclined surface 11b of the contacting portion 11 will make the conductive end 11a to open, then the pin 41 and the conductive end 11a will construct an electrical conductivity.

But the conventional structure can be concluded with the following defects:

1. The pin 41 contacts the conductive end 11a only at one side, hence this arrangement can not form a tight contact thereof. A poor electrical conductivity may occur thereof.

2. The contacting portion 11 of the pin socket 1 is biased to one side, a metal fatigue may occur after a period of time. The service life may decrease accordingly.

3. Although some conventional structure has been modified into two parallel contacting ends, the pin 41 shall push those parallel contacting ends outward to open it. Hence the friction force generated by those two parallel contacting ends is very large. A concentrated force may apply to the pin 41 and make the pin 41 to deform. A poor conductivity will occur thereof. The pin 41 may break out.

SUMMARY OF THE INVENTION

The object of this invention is to provide an electrical connector with ZIF socket which features a specially designed pin socket. The pin socket is made from a metal sheet and two contacting ends are formed thereof. By this arrangement, the pin has an excellent double-side contact with the contacting end to facilitate a sound electrical conductivity.

It is still the object of this invention to provide an electrical connector with ZIF socket wherein the conductive end is opened in two-stage to prevent a concentrated force applied to the pin. Hence the durability of the pin is prolonged.

It is still the object of this invention to provide an electrical connector with ZIF socket wherein the pin of the PGA packages is moved by a sliding support. As a result, the contacting end of the pin socket is opened easily. Besides, the pin of the PGA packages is biased to contact with the contacting end of the pin socket to ensure an excellent conductivity.

BRIEF DESCRIPTION OF THE DRAWINGS

The objects and other advantages of this instant invention will become more apparently as in conjunction with a preferred embodiment and drawings accompanied thereof; wherein

FIG. 8A is another embodiment of the electrical connector, wherein the contacting end of the socket pin is still not engaged with the pin socket;

FIG. 8B is the embodiment illustrated in FIG. 8A, wherein the pin of the PGA packages is engaged with the pin socket of the electrical connector;

FIG. 9A is a front view of a conventional pin socket;

FIG. 9B is a left elevational view of the pin socket shown in FIG. 9A;

FIG. 9C is a top view of the pin socket shown in FIG. 9A;

FIG. 10A is a sketch view of a conventional electrical connector, wherein the contacting end of the socket pin is still not engaged with the pin socket;

FIG. 10B is a sketch view of a conventional electrical connector, wherein the contacting end of the socket pin is engaged with the pin socket;

FIG. 10C is a top cross sectional view of the conventional electrical connector, showing the pin of the PGA packages is engaged with the pin socket;

FIG. 13 is a partial sectional view of the electrical connector of FIG. 8B taken across the section line 13—13; and, FIG. 14 is a partial sectional view of the electrical connector of FIG. 8A taken across the section line 14—14.

DETAILED DESCRIPTION OF THE INVENTION

Figure 1:
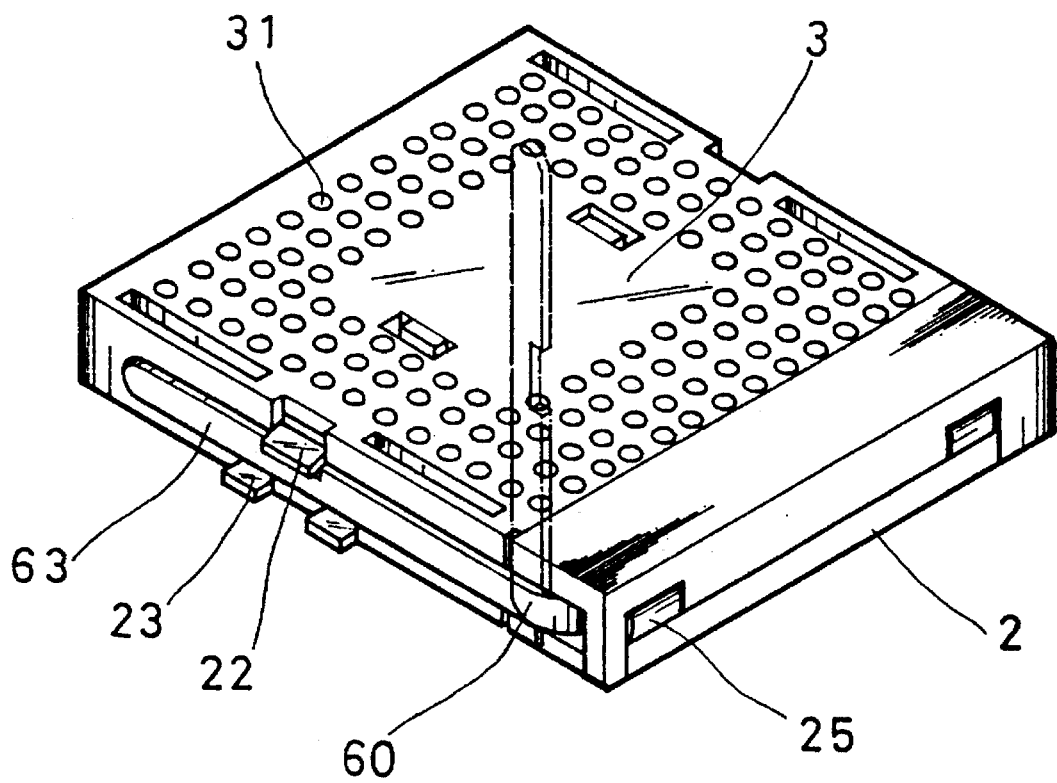
FIG. 1 is a perspective view of an electrical connector with ZIF socket made according to this invention (PGA package not yet assembled)
Figure 2:
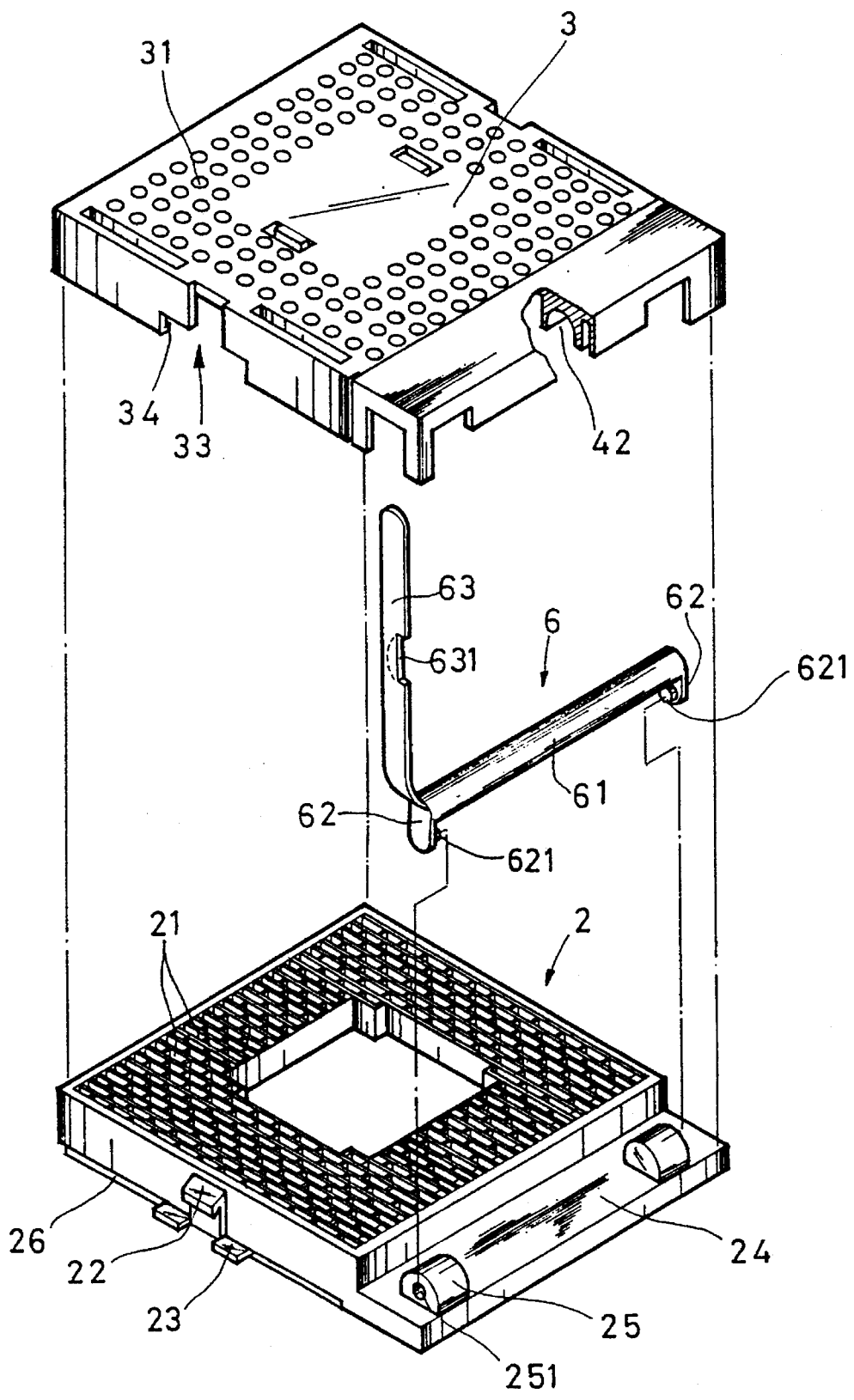
FIG. 2 is a perspective exploded view of an electrical connector with ZIF socket made according to the invention.

Referring to FIGS. 1 and 2, the electrical connector made according to this invention comprises a socket body 2. The socket body 2 has a plurality rows of slots 21 at the upper portion for receiving the socket pin 5, not shown in FIG. 2. A retaining block 22 and positioning block 23 are disposed at side portion. A recessed portion 24 is disposed at the front portion. A projected portion 25 is disposed at both sides of the recessed portion 24. A hole 251 is defined at both sides of the projected portion 25. An actuating level 6 defines an actuating portion 61 thereunder. A lug 62 is defined thereof. A post 621 is disposed at said lug 62. Said post 621 is pivoted to the hole 251 of the projected portion 25. An actuating arm 63 is connected to one side of the actuating portion 61. A groove 631 is defined at the middle portion of the actuating arm 61 which can be positioned to the retaining block 22 of the socket body 2. A sliding support 3 defines a plurality of holes 31 with respect to the slot 21 of the socket body 2. By this arrangement, the pins 41 of the PGA packages 4 can be received by the holes 31. A retaining slot 32 which can engage with the upper portion of the actuating portion 61 is disposed at the front lower end of the sliding support 3. A cutout 33 is provided at side for the movement of the sliding support 3. The sliding support 3 further includes a hook 34 projected inward and the hook 34 can engage with a notch 26 located at the underside of the socket body 2. By the rotation of the actuating lever 6, the sliding support 3 is moved on the socket body 2. Since the configuration of the PGA packages is known by the skilled in the art, and is not the subject matter of the present invention, no further description is given accordingly.

Figure 3:
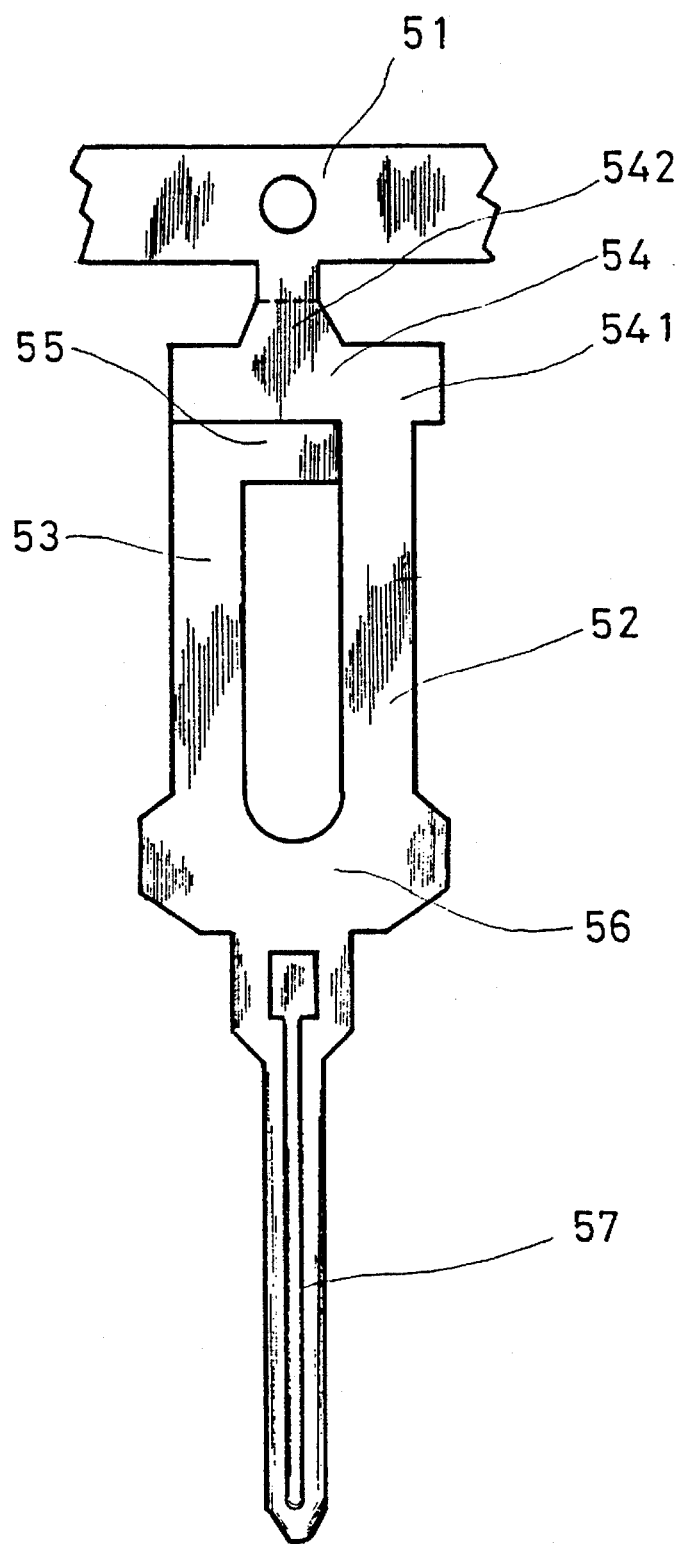
FIG. 3 is a material strip used to make the pin socket.

Referring to FIG. 3, the pin socket 5 made according to this invention is formed directly from punching a metal sheet. After pin socket 5 is punched, a first supporting arm 52 and a second supporting arm 53 are defined thereof. The first supporting arm 52 is longer than the second supporting arm 53. The first supporting arm 52 and the second supporting arm 53 further are formed a first contacting end 54 and a second contacting end 55 respectively at their upper portion. The first contacting end 54 and the second contacting end 55 are intersected with each other. An actuating tab 542 which is interconnected with the metal sheet is defined at the first contacting end 54. A retaining portion 56 is formed at the lower end of the first contacting end 54 and the second contacting end 55. A leg 57 is defined at the lower portion of the retaining portion 56. A flange portion 541 is defined at one side of the first contacting end 54. When a further machining procedure is applied to the raw pin socket 5, a finished pin socket 5 is completed, as shown in FIGS. 4 and 5.

Figure 4:
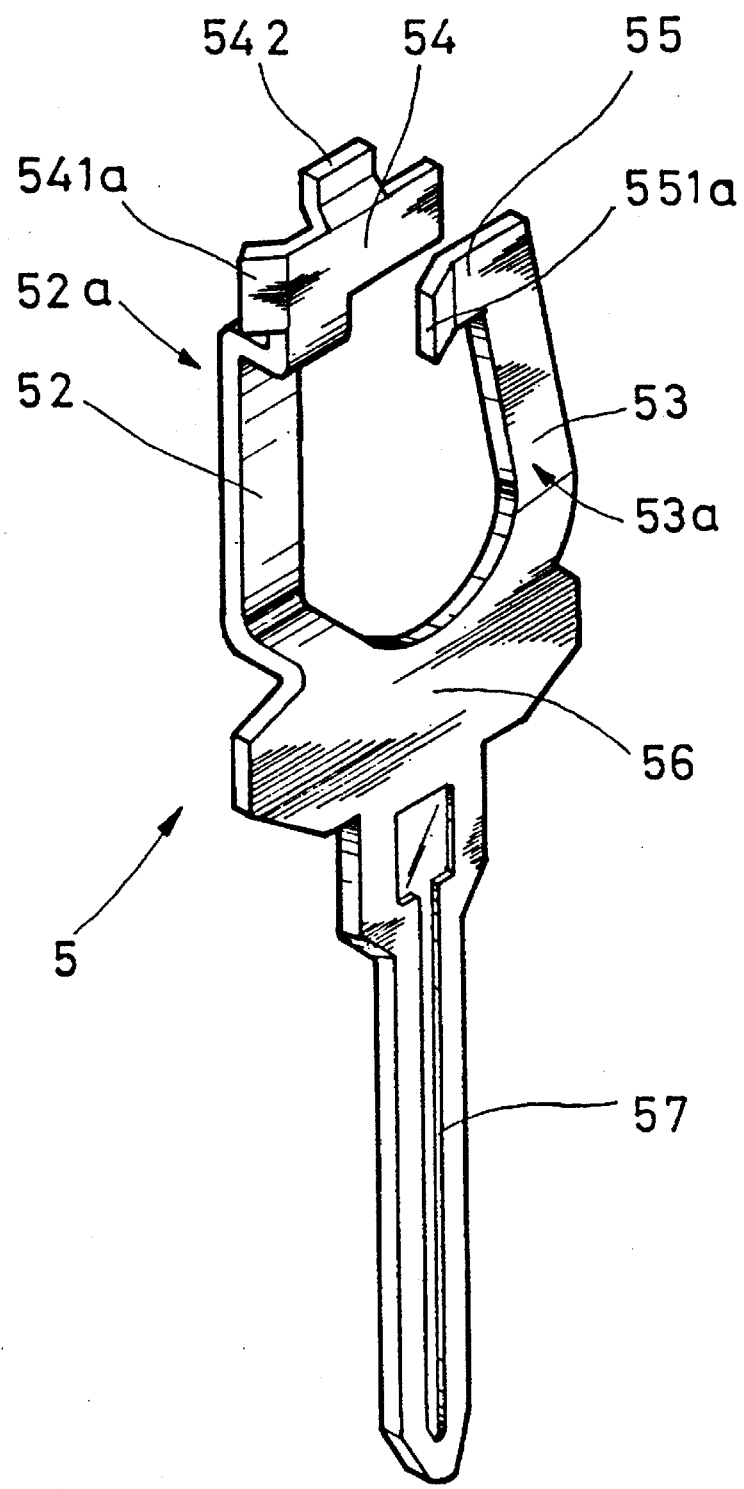
FIG. 4 is a perspective view of the pin socket.
Figure 5C:
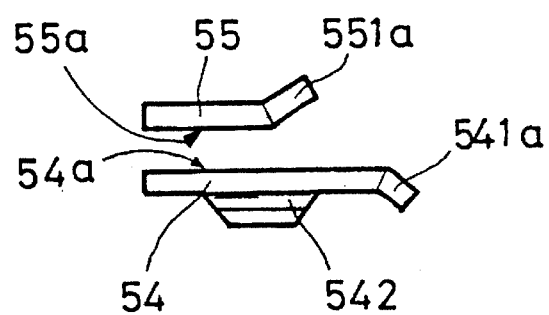
FIG. 5C is a top view of the pin socket.
Figure 5A:
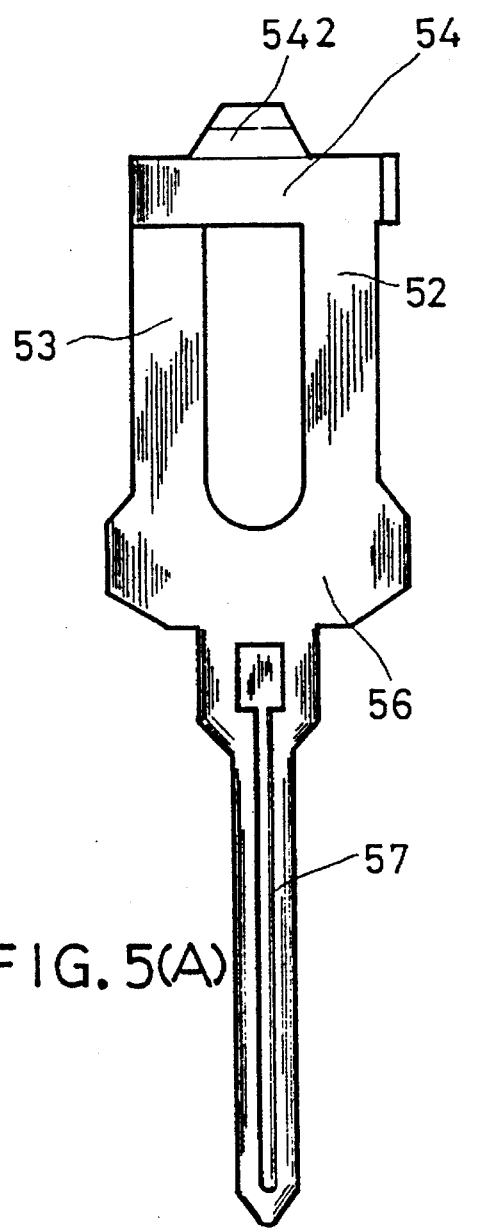
FIG. 5A is a front view of the pin socket.

A shown in FIGS. 4 and 5, a first curve portion 52a is formed at the first supporting arm 52 and a second curve portion 53a is formed at the second supporting arm 53. The first curve portion 52a is larger than the second curve portion 53a. By this arrangement, the first contacting end 54 and the second contacting end 55 are separated with each other. A first conductive surface 54a and a second conductive surface 54b is defined at the first contacting end 54 and the second contacting end 55 respectively thereof. A flange 541 is projected outward from the first conductive surface 54a and defines a guiding surface 541a. A guiding surface 551a is defined at the front surface of the conducting surface 55a.

By this arrangement and layout, the pin socket 5 can be punched directly by a single metal sheet, advantageously, two conductive surfaces 54a, 55a are formed to facilitate an excellent electricity conductivity between the pin 41 of the PGA packages 4 and the pin socket 5. The concentrated force and friction force are reduced accordingly.

Figure 6A:
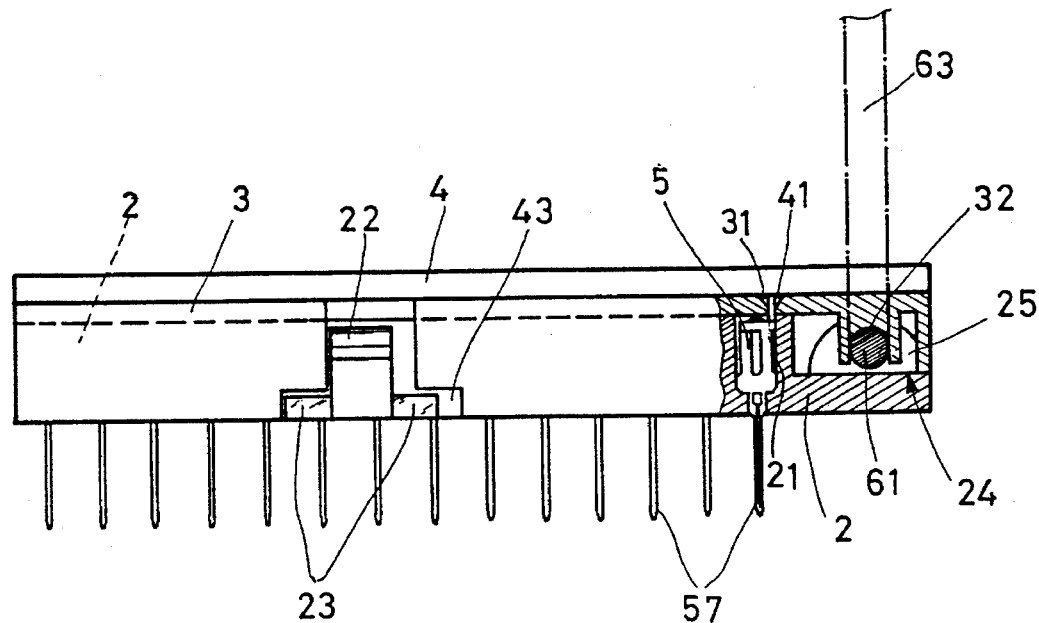
FIG. 6A is a sketch view of the electrical connector, wherein the pin of the PGA packages is still not engaged with the pin socket of the electrical connector.
Figure 6B:
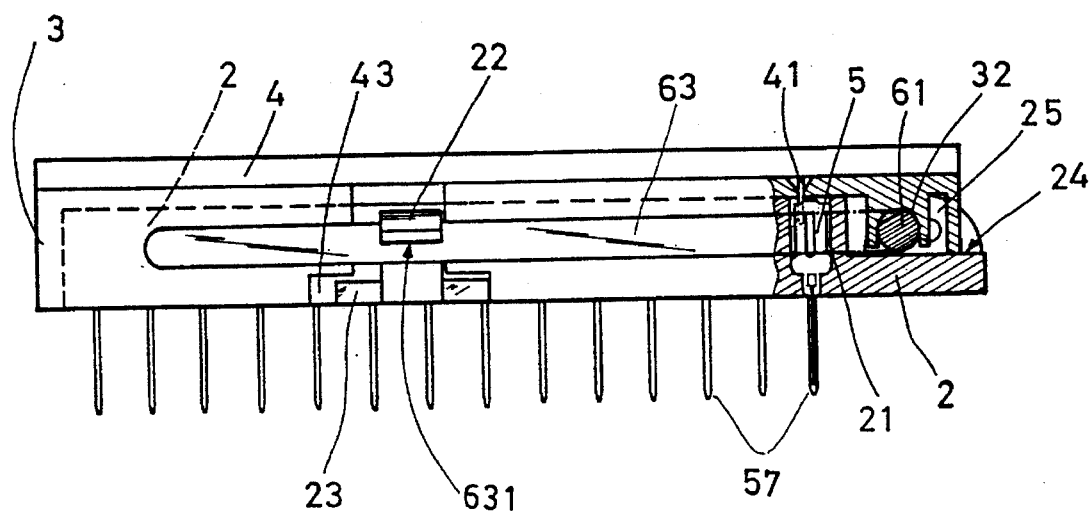
FIG. 6B is a sketch view of the electrical connector, wherein the pin of the PGA packages is engaged with the pin socket of the electrical connector.
Figure 11:
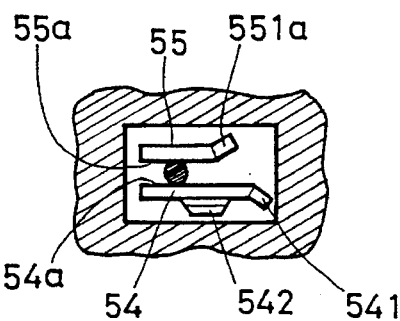
FIG. 11 is a partial sectional view of the electrical connector of FIG. 7B taken across the section line 11—11.
Figure 12:
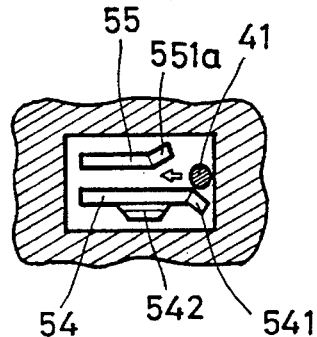
FIG. 12 is a partial sectional view of the electrical connector of FIG. 7A taken across the section line 12—12.
Figure 7B:
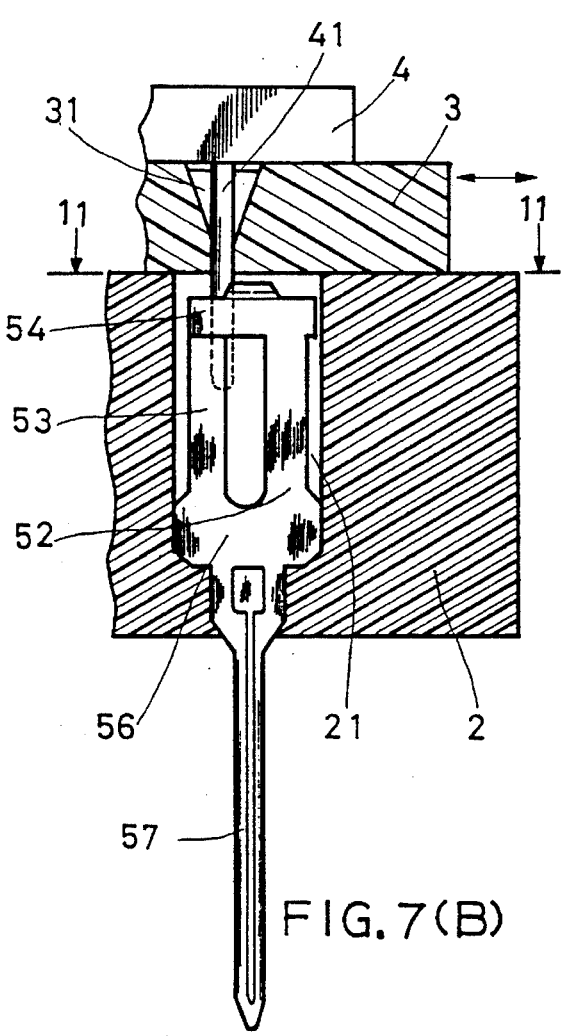
FIG. 7B is a sketch view of the electrical connector, wherein the contacting end of the socket pin is opened by the pin of the PGA packages.

Referring to FIGS. 6A and 6B, the pin socket 5 is inserted and disposed into the slot 21 of the socket body 2. The pin 41 of the PGA packages 4 can pass through the hole 31 of the sliding support 3 and then be retained into the slot 21 of the socket body 2. The actuating arm 63 of the actuating lever 6 shown in FIG. 6A is in vertical position, an open position. The pin 41 of the PGA packages 4 is still not engaged with the pin socket 5. At this position, the PGA packages 4 can be easily removed from the sliding support 3 or inserted into the sliding support 3. As shown in FIG. 6B, when the actuating arm 63 of the actuating lever is rotated ninety (90) degrees and retained by the retaining block 22, the actuating portion 61 is moved forward with the rotating center. The retaining slot 32 is moved forward accordingly. As a result, the PGA packages 4 is moved as the sliding support 3 moves. At last, the pin 41 of the PGA packages 4 is engaged with the pin socket 5. The engagement of the pin 41 of the PGA packages 4 and the pin socket 5 will be detained as described at FIGS. 7A and 7B.

Figure 7A:
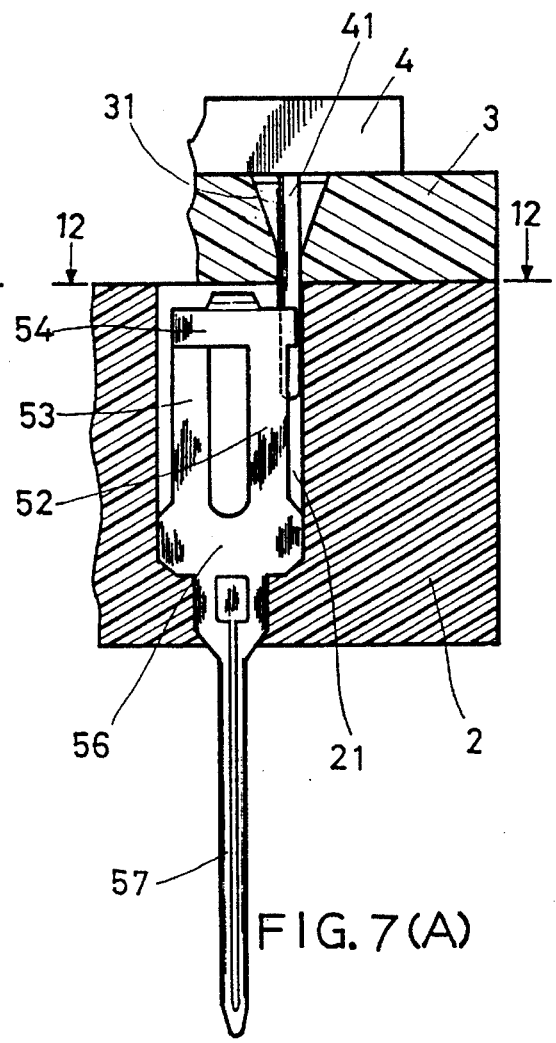
FIG. 7A is a sketch view of the electrical connector, wherein the contacting end of the socket pin is still not engaged with the pin socket.

As shown in FIG. 7A, the sliding support 3 is in an open position. Then the PGA packages 4 can be put onto the sliding support 3 making the pin 41 inserts into the slot 21 of the socket body 2 through the hole 31 of the sliding support 3. When the sliding support 3 moves traverse, the pin 41 of the PGA packages 4 will insert into the opening between the first contacting end 54 and the second contacting end 55. By this arrangement, the pin 41 of the PGA packages meets the guiding surface 541a of the first contacting end 54 firstly. When the pin 41 keeps on moving in, the first contacting end 54 is biased outward. This can be referred as the first stage contacting. Then the pin 41 meets the guiding surface 551a of the second contacting end 55 when the pin 41 moves to the one third distance of the first contacting end 54. The second contacting end 55 is biased outward as long as the pin 41 moves in. This is referred to as the second contacting stage. When the sliding support 3 is moved to a desired position, the pin 41 of the PGA packages 4 is positioned and engaged with the first conductive surface 54a and the second conductive surface 54b and form an excellent electricity conductivity. Since the engagement of the pin 41 with the first contacting end 54 and the second contacting end 55 is by two-stage contacting, the friction force generated thereof is largely reduced. The concentrated force which makes the pin 41 to bend is avoided accordingly. As a result, the service life of the pin 41 is prolonged.

As shown in FIG. 8, another embodiment of the pin socket 5 is shown. The pin socket 5 is inserted into a slot 21a of the socket body 2a by side. The slot 21a is specially designed for the pin socket 5. Accordingly, the orientation is rotated ninety (90) degrees. A retaining slot 32a is disposed at the lower portion of the sliding support 3a. The retaining slot 32a can receive an actuating tap 542 of the first contacting end 54. The diameter of the hole 31a of the sliding support 3a is larger than the outer diameter of the pin 41 of the PGA socket 4, hence a space is provided for the movement of the pin 41. When the PGA packages 4 is still not inserted into the sliding support 3a and socket body 2a, the first contacting end 54 of the pin socket 5 is inclined outward and openly. When the PGA package 4 is inserted into the socket body 2a, by the same movement, the sliding support 3a is moved traverse, accordingly, the first contacting end 54 is moved accordingly. Then the contacting end 54 is in contact with the pin 41. As the sliding supporting 3a is moved continuously, the second contacting end 55 is in contact with the pin 41. When the sliding support 3a is moved a predetermined position, then pin 41 is positioned with the first conductive surface 54a and a second conductive surface 54b. The pin 41 is clamped by the first conductive surface 54a and a second conductive surface 54b.

The invention can be concluded with the following advantages.

1. The pin socket 5 is directly punched from a metal sheet to form a first supporting arm 52 and a second supporting arm 53, wherein the first supporting arm 52 is longer than the second supporting arm 53. A first curve portion 52a is formed at the first supporting arm 52 and a second curve portion 53a is formed at the second supporting arm 53. Accordingly, the pin 41 has an even contact with the first contacting end 54 and a second contacting end 55. The pin 41 then has a tight contact with the pin socket 5. An excellent electricity is achieved.

2. A first guiding surface 541a and a second guiding surface 551a is provided respectively at the first contacting end 54 and the second contacting end 55. Then the first contacting end 54 and the second contacting end 55 are biased outward respectively, in two stage. The concentrated force applied to the pin 41 is reduced advantageously. As a result, the pin 41 will not bend.

Figure 5B:
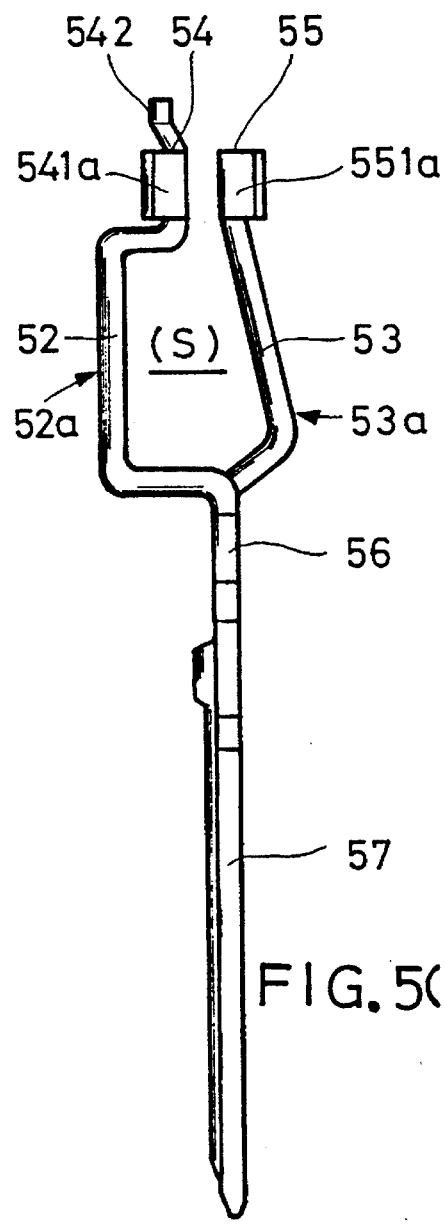
FIG. 5B is a side view of the pin socket.

3. A first curve portion 52a is formed at the first supporting arm 52 and a second curve portion 53a is formed at the second supporting arm 53. Accordingly, an inserting space (S) is formed thereof, as shown in FIG. 5B. In light of this, the lower portion of the pin 41 is free contacting with the pin socket 5. The effective contact focus on the first contacting end 54 and the second contacting end 55. Hence, the friction force is reduced to the lowest level and the pin 41 will not bend or break off.

4. By the movement of the actuating lever 6, the PGA packages 4 can be put or removed as the socket body 2 is open. The user can do this work easily. Besides, the actuating arm 63 of the actuating lever 6 can be positioned as the groove 631 is retained by the retaining block 22. Hence the sliding support 3 is retained from moving.

Although the present invention has been described in connection with preferred embodiments thereof, many other variations and modifications will now become apparent to those skilled in the art without departing from the scope of the invention. It is preferred, therefore, that the present invention not be limited by the specific disclosure herein, but only by the appended claims.

I claim:

1. An electrical connector with ZIF socket, comprising:

a socket body having a front portion and a rear portion disposed on opposing longitudinal ends thereof, and a pair of opposing side portions, said socket body further having a plurality of rows of slots formed in an upper portion thereof for receiving a socket pin, said socket body including a retaining block and positioning block formed on each of said pair of side portions, said socket body having a recessed portion being formed in said front portion, said recessed portion having a pair of laterally spaced projecting portions formed therein, each of said projecting portions having a hole formed in a respective outer end thereof, said socket body having a longitudinally directed notch formed adjacent a lower edge of each of said pair of side portions;

an actuating lever pivotally coupled to said pair of projecting portions of said socket body, said actuating lever having an actuating portion extending between said pair of projecting portions;

a sliding support having a pair of opposing side walls and a plurality of holes formed through a top surface thereof, said plurality of holes being disposed in axially aligned relationship with said slots of said socket body for receiving a pin of a PGA package, said sliding support having an interior surface with a first retaining slot formed adjacent one end thereof for engagement with said actuating portion of said actuating lever, said interior surface having a plurality of second retaining slots formed therein, each of said plurality of second retaining slots being disposed adjacent a respective one of said plurality of holes, said sliding support having a cutout formed in each of said opposing side walls, said sliding support further including an inwardly directed hook formed in each of said opposing side walls for engagement with a respective notch of said socket body, said sliding support being longitudinally displaceable on the socket body responsive to rotation of said actuating lever;

a pin socket formed from a metal sheet, said pin socket including a first supporting arm and a second supporting arm formed on one end thereof, said first supporting arm having a longer length than said second supporting arm, said first supporting arm having a first contacting end disposed at a distal end thereof and defining a first conductive surface, said first contacting end having an actuating tab formed thereon for engagement within a respective one of said plurality of second retaining slots for displacing said first contacting end relative to said second contacting end responsive to displacement of said sliding support, thereby clamping a pin of the PGA package between said first and second contacting ends, said second supporting arm having a second contacting end disposed at a distal end thereof and defining a second conductive surface, said first contacting end and said second contacting end being disposed in spaced parallel relationship one with respect to the other, said first supporting arm having a first curved portion formed therein, said second supporting arm having a second curved portion formed therein, said first curve portion being larger than the second curve portion.

2. An electrical connector with ZIF socket, comprising:

a socket body having a front portion and a rear portion disposed on opposing longitudinal ends thereof, and a pair of opposing side portions, said socket body further having a plurality of rows of slots formed in an upper portion thereof for receiving a socket pin, said socket body including a retaining block and positioning block formed on each of said pair of side portions, said socket body having a recessed portion being formed in said front portion, said recessed portion having a pair of laterally spaced projecting portions formed therein, each of said projecting portions having a hole formed in a respective outer end thereof, said socket body having a longitudinally directed notch formed adjacent a lower edge of each of said pair of side portions;

an actuating lever pivotally coupled to said pair of projecting portions of said socket body, said actuating lever having an actuating portion extending between a pair of lug members formed on opposing ends thereof, each of said pair of lug members having a post extending therefrom for receipt within a respective one of said holes formed in said projecting portions, said actuating lever including an actuating arm coupled to one end of said actuating portion, said actuating arm having a groove formed therein disposed intermediate opposing ends thereof for engagement with said retaining block of said socket body;

a sliding support having a pair of opposing side walls and a plurality of holes formed through a top surface thereof, said plurality of holes being disposed in axially aligned relationship with said slots of said socket body for receiving a pin of a PGA package, said sliding support having an interior surface with a first retaining slot formed adjacent one end thereof for engagement with said actuating portion of said actuating lever, said interior surface having a plurality of second retaining slots formed therein, each of said plurality of second retaining slots being disposed adjacent a respective one of said plurality of holes, said sliding support having a cutout formed in each of said opposing side walls, said sliding support further including an inwardly directed hook formed in each of said opposing side walls for engagement with a respective notch of said socket body, said sliding support being longitudinally displaceable on the socket body responsive to rotation of said actuating lever;

a pin socket formed from a metal sheet, said pin socket including a first supporting arm and a second supporting arm formed on one end thereof, said first supporting arm having a longer length than said second supporting arm, said first supporting arm having a first contacting end disposed at a distal end thereof and defining a first conductive surface, said second supporting arm having a second contacting end disposed at a distal end thereof and defining a second conductive surface, said first contacting end and said second contacting end being disposed in spaced parallel relationship one with respect to the other, said first supporting arm having a first curved portion formed therein, said second supporting arm having a second curved portion formed therein, said first curve portion being larger than the second curve portion.

* * * * *